(12) United States Patent
Hase

(10) Patent No.: US 9,917,550 B2
(45) Date of Patent: Mar. 13, 2018

(54) POWER AMPLIFICATION CIRCUIT

(71) Applicant: MURATA MANUFACTURING CO., LTD., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/381,528

(22) Filed: Dec. 16, 2016

(65) Prior Publication Data
US 2017/0279413 A1 Sep. 28, 2017

(30) Foreign Application Priority Data

Mar. 28, 2016 (JP) ................. 2016-064501

(51) Int. Cl.
*H03F 3/04* (2006.01)
*H03F 1/02* (2006.01)
*H03F 3/19* (2006.01)
*H03F 3/21* (2006.01)
*H03F 1/56* (2006.01)
*H03F 3/191* (2006.01)

(52) U.S. Cl.
CPC ............ *H03F 1/0222* (2013.01); *H03F 1/56* (2013.01); *H03F 3/19* (2013.01); *H03F 3/21* (2013.01); *H03F 1/565* (2013.01); *H03F 3/04* (2013.01); *H03F 3/191* (2013.01); *H03F 2200/111* (2013.01); *H03F 2200/222* (2013.01); *H03F 2200/318* (2013.01); *H03F 2200/387* (2013.01); *H03F 2200/411* (2013.01); *H03F 2200/451* (2013.01)

(58) Field of Classification Search
CPC . H03F 1/0222; H03F 1/56; H03F 3/19; H03F 3/21; H03F 1/08; H03F 1/24; H03F 1/36; H03F 3/52; H03F 1/0261; H03F 3/72; H03F 1/22; H03F 1/50; H03F 3/02; H03G 3/3042; H03G 5/16; H03B 5/1221
USPC ............... 330/98, 133, 150, 296, 302, 310
See application file for complete search history.

(56) References Cited

U.S. PATENT DOCUMENTS 4,677,392 A * 6/1987 Yang ................ G01S 7/4021
330/284
5,281,925 A * 1/1994 Hulick ............... H03F 1/0261
327/170
5,488,382 A * 1/1996 Fenzi .................... H01Q 1/26
343/700 R (Continued)

FOREIGN PATENT DOCUMENTS

JP 2000-026072 A 1/2000
JP 2000-278109 A 10/2000
JP 2006-279317 A 10/2006

*Primary Examiner* — Khanh V Nguyen
(74) *Attorney, Agent, or Firm* — Pearne & Gordon LLP

(57) ABSTRACT

Provided is a power amplification circuit that includes: a first transistor that has an emitter to which a first radio frequency signal is supplied, a base to which a first DC control current or DC control voltage is supplied and a collector that outputs a first output signal that corresponds to the first radio frequency signal; a first amplifier that amplifies the first output signal and outputs a first amplified signal; and a first control circuit that supplies the first DC control current or DC control voltage to the base of the first transistor in order to control output of the first output signal.

19 Claims, 10 Drawing Sheets

(56) References Cited

U.S. PATENT DOCUMENTS

| | | | | |
|---|---|---|---|---|
| 5,933,057 A * | 8/1999 | Tchamov | ............... | H03F 3/191 |
| | | | | 330/302 |
| 6,252,463 B1 * | 6/2001 | Kobayashi | ............... | H03F 1/22 |
| | | | | 330/295 |
| 6,724,253 B2 * | 4/2004 | Hau | ............... | H03F 1/3276 |
| | | | | 330/144 |
| 6,801,084 B2 * | 10/2004 | Smith | ............... | H03F 3/3432 |
| | | | | 330/310 |
| 7,265,630 B2 * | 9/2007 | Floyd | ............... | H03F 1/22 |
| | | | | 330/302 |
| 7,863,979 B2 * | 1/2011 | Chung | ............... | H03F 1/0277 |
| | | | | 330/124 R |
| 9,444,416 B1 * | 9/2016 | Bisby | ............... | H03F 3/193 |
| 2003/0058045 A1 * | 3/2003 | Taylor | ............... | H03G 3/3042 |
| | | | | 330/133 |
| 2010/0060354 A1 * | 3/2010 | Maeda | ............... | H03F 1/42 |
| | | | | 330/124 R |

\* cited by examiner

POWER AMPLIFICATION CIRCUIT

This application claims priority from Japanese Patent Application No. 2016-064501 filed on Mar. 28, 2016. The contents of this application are incorporated herein by reference in its entirety.

BACKGROUND

The present disclosure relates to a power amplification circuit.

A power amplification circuit is used in a mobile communication device such as a cellular phone in order to amplify the power of a radio frequency (RF) signal to be transmitted to a base station. When a plurality of amplifiers is used together in a power amplification circuit for example, a switch is employed to control switching on and off of the amplifiers in order to reduce current consumption. For example, Japanese Unexamined Patent Application Publication No. 2000-278109 discloses a high-frequency switch that is formed of two cascode-connected bipolar transistors.

In the high-frequency switch disclosed in Japanese Unexamined Patent Application Publication No. 2000-278109, an input signal is supplied to the base of a first-stage bipolar transistor and an output signal is output from the collector of a second-stage bipolar transistor in accordance with a control signal supplied to the base of the second-stage bipolar transistor. However, since the two bipolar transistors of the switch are cascode connected with each other, the amplitude of the output signal is restricted by the saturation voltages of these transistors. Therefore, the amplitude of the output signal is restricted and the output signal is likely to be distorted when a large signal is input. Consequently, it is difficult to achieve desired linearity characteristics and the operational range in which the switch can be used is narrow. Furthermore, since the bipolar transistor of the second stage needs to be of such a size as to be able to supply a current of the same size as the current supplied to the bipolar transistor of the first stage, an increase in circuit area is incurred due to an increase in the number of elements.

BRIEF SUMMARY

The present disclosure was made in light of the above-described circumstances and to provide a power amplification circuit that includes a switch circuit that can be used even when a large signal is input and that suppresses an increase in circuit area.

A power amplification circuit according an embodiment of the present disclosure includes: a first transistor that has an emitter to which a first radio frequency signal is supplied, a base to which a first DC control current or DC control voltage is supplied and a collector that outputs a first output signal that corresponds to the first radio frequency signal; a first amplifier that amplifies the first output signal and outputs a first amplified signal; and a first control circuit that supplies the first DC control current or DC control voltage to the base of the first transistor in order to control output of the first output signal.

According to the embodiment of the present disclosure, a power amplification circuit can be provided that includes a switch that can be used even when a large signal is input and that suppresses an increase in circuit area.

Other features, elements, characteristics and advantages of the present disclosure will become more apparent from the following detailed description of preferred embodiments of the present disclosure with reference to the attached drawings.

DETAILED DESCRIPTION

Figure 1:
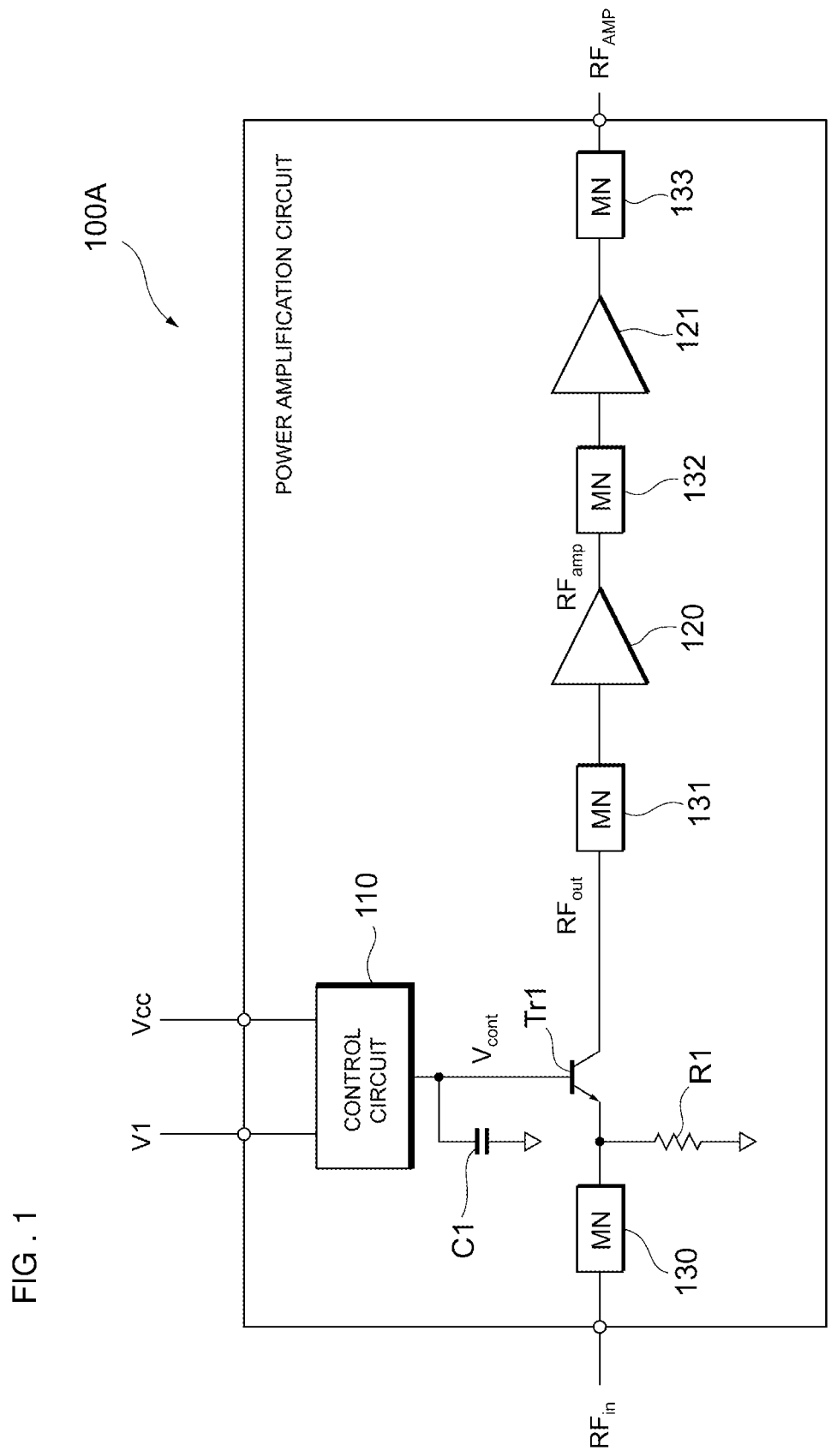
FIG. 1 illustrates an example configuration of a power amplification circuit according to an embodiment of the present disclosure.

Hereafter, an embodiment of the present disclosure will be described in detail while referring to the drawings. Elements that are the same as each other will be denoted by the same symbols and repeated description thereof will be omitted.

FIG. 1 illustrates an example configuration (power amplification circuit 100A) of a power amplification circuit 100 according to an embodiment of the present disclosure. The power amplification circuit 100A amplifies an input signal $RF_{in}$ and outputs an amplified signal $RF_{AMP}$.

As illustrated in FIG. 1, the power amplification circuit 100A includes a bipolar transistor Tr1, a resistance element R1, a capacitor C1, a control circuit 110, amplifiers 120 and 121 and matching networks 130, 131, 132 and 133.

The input signal $RF_{in}$ (first radio frequency signal) is supplied to the emitter of the bipolar transistor Tr1 (first transistor) via the matching network 130, a control voltage $V_{cont}$ is supplied to the base of the bipolar transistor Tr1, and the bipolar transistor Tr1 outputs an output signal $RF_{out}$ (first output signal) from the collector thereof. In addition, the emitter of the bipolar transistor Tr1 is DC grounded via the resistance element R1 and the base of the bipolar transistor Tr1 is AC grounded via the capacitor C1. Operation of the bipolar transistor Tr1 will be described in detail later.

One end of the resistance element R1 is connected to the emitter of the bipolar transistor Tr1 and the other end of the resistance element R1 is grounded. The resistance element R1 DC grounds the emitter of the bipolar transistor Tr1.

One end of the capacitor C1 is connected to the base of the bipolar transistor Tr1 and the other end of the capacitor C1 is grounded. The capacitor C1 AC grounds the base of the bipolar transistor Tr1.

The control circuit 110 (first control circuit) supplies the control voltage $V_{cont}$ (first DC control voltage), which corresponds to a voltage V1 supplied from outside the power amplification circuit 100A, to the base of the bipolar transistor Tr1.

Figure 2:
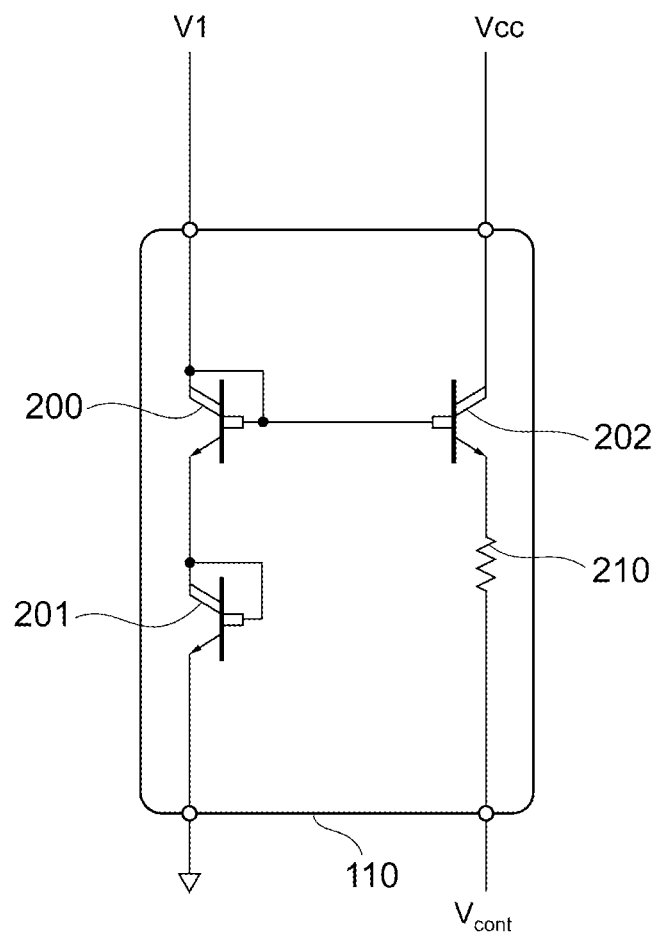
FIG. 2 illustrates an example of the configuration of a control circuit.

FIG. 2 illustrates an example of the configuration of the control circuit 110. As illustrated in FIG. 2, the control circuit 110 includes bipolar transistors 200, 201 and 202 and a resistance element 210.

The bipolar transistors 200 and 201 are each configured to generate a voltage of a prescribed level. Specifically, the collector and the base of the bipolar transistor 200 are connected to each other (hereafter, "diode connected"), the voltage V1 is supplied to the collector of the bipolar transistor 200 and the emitter of the bipolar transistor 200 is connected to the collector of the bipolar transistor 201. The bipolar transistor 201 is diode connected, the collector thereof is connected to the emitter of the bipolar transistor 200 and emitter of the bipolar transistor 201 is connected to ground. Thus, a voltage of a prescribed level (for example, around 2.6 V) is generated at the base of the bipolar transistor 200. Diodes may be used instead of the bipolar transistors 200 and 201.

A power supply voltage Vcc is supplied to the collector of the bipolar transistor 202, the base of the bipolar transistor 202 is connected to the base of the bipolar transistor 200 and the emitter of the bipolar transistor 202 is connected to one end of the resistance element 210. The bipolar transistor 202 supplies the control voltage $V_{cont}$ from the emitter thereof to the base of the bipolar transistor Tr1 via the resistance element 210.

Thus, the control circuit 110 forms an emitter-follower-type bias circuit that supplies the control voltage $V_{cont}$ (bias voltage) to the base of the bipolar transistor Tr1. The control circuit 110 can switch the bipolar transistor Tr1 on and off by controlling the control voltage $V_{cont}$ supplied to the base of the bipolar transistor Tr1. Thus, the bipolar transistor Tr1 functions as a switch. The control circuit 110 can be given a temperature compensation function by forming the control circuit 110 using bipolar transistors that are the same as the bipolar transistor Tr1.

Returning to FIG. 1, the amplifiers 120 and 121 form a two-stage amplification circuit. The amplifier 120 (first amplifier) (drive stage) amplifies the output signal $RF_{out}$ (first output signal) input via the matching network 131 and outputs an amplified signal $RF_{amp}$ (first amplified signal). The amplified signal $RF_{amp}$ output from the amplifier 120 is input to the amplifier 121 via the matching network 132. The amplifier 121 (power stage) amplifies the amplified signal $RF_{amp}$ and outputs the amplified signal $RF_{AMP}$ via the matching network 133. In this embodiment, an example is illustrated in which the number of amplifier stages is two, but the number of amplifier stages is not limited to two and may be one or three or more.

Figure 3:
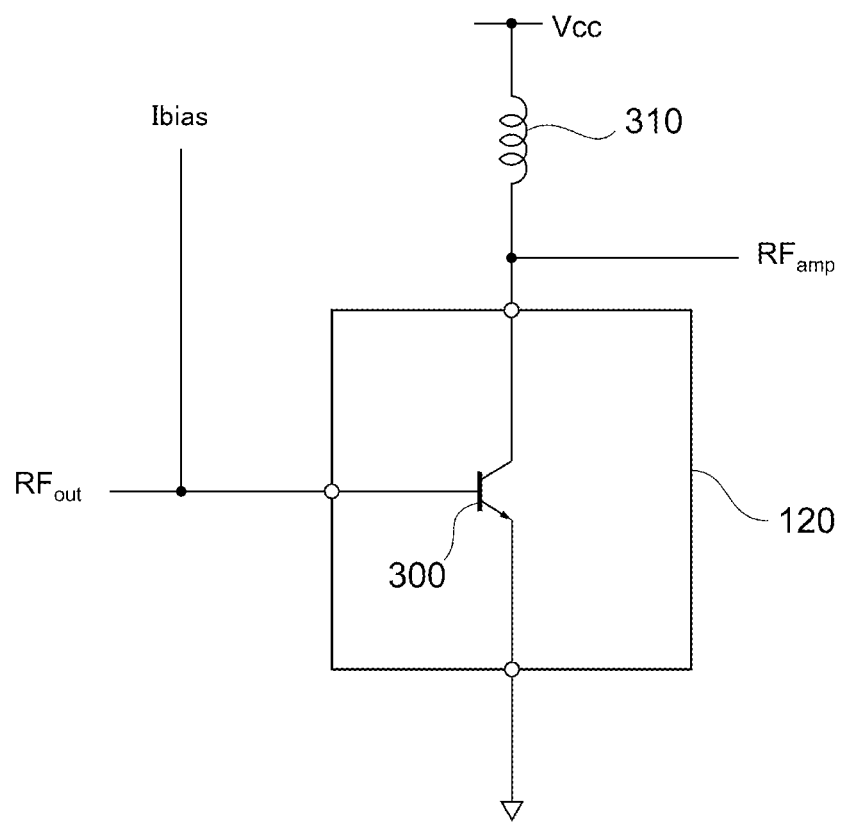
FIG. 3 illustrates an example of the configuration of an amplifier.

FIG. 3 illustrates an example of the configuration of the amplifier 120. As illustrated in FIG. 3, the amplifier 120 includes a bipolar transistor 300.

The power supply voltage Vcc is supplied to the collector of the bipolar transistor 300 via an inductor 310, the output signal $RF_{out}$ is input to the base of the bipolar transistor 300 and the bipolar transistor 300 has a common emitter. In addition, a bias current Ibias is supplied to the base of the bipolar transistor 300. The amplified signal $RF_{amp}$ is output from the collector of the bipolar transistor 300. In this embodiment, description is given using a heterojunction bipolar transistor (HBT) as an example of a transistor, but a metal-oxide-semiconductor field effect transistor (MOSFET) may be used as the transistor instead. In addition, since the configuration of the amplifier 121 is the same as that of the amplifier 120, detailed description thereof is omitted.

Returning to FIG. 1, the matching networks (MNs) 130, 131, 132 and 133 are provided in order to match impedances between the circuits. The matching networks 130, 131, 132 and 133 are formed using inductors and capacitors, for example. The matching network 130 is formed of a high pass filter circuit or a low pass filter circuit, for example.

Operation of the bipolar transistor Tr1 of the power amplification circuit 100A is controlled in accordance with the control voltage $V_{cont}$ supplied to the base of the bipolar transistor Tr1. Specifically, when a comparatively high control voltage $V_{cont}$ is supplied to the base of the bipolar transistor Tr1 and the base-emitter voltage of the bipolar transistor Tr1 is higher than a threshold voltage, the bipolar transistor Tr1 switches on and the output signal $RF_{out}$ is output. On the other hand, when a comparatively low control voltage $V_{cont}$ (for example, 0 V) is supplied to the base of the bipolar transistor Tr1 and the base-emitter voltage of the bipolar transistor Tr1 is lower than the threshold voltage, the bipolar transistor Tr1 switches off and the output signal $RF_{out}$ is not output. Thus, the bipolar transistor Tr1 functions as a switch that controls whether the input signal $RF_{in}$ is allowed to pass therethrough in accordance with the control voltage $V_{cont}$.

In this embodiment, the control circuit 110 generates a control voltage, but the control circuit 110 may control operation of the bipolar transistor Tr1 by using a control current (first DC control current) instead of a control voltage. Specifically, the control circuit 110 may switch the bipolar transistor Tr1 on by supplying a comparatively large control current (for example, around several hundred μA to 1 mA) to the base of the bipolar transistor Tr1 and may switch the bipolar transistor Tr1 off by supplying a comparatively small control current (for example, around 0 mA) to the base of the bipolar transistor Tr1.

With the above-described configuration, the single bipolar transistor Tr1 controls switching on and off of passage of the input signal $RF_{in}$ in the power amplification circuit 100A. Therefore, since there is no need to cascode connect two bipolar transistors as described in Japanese Unexamined Patent Application Publication No. 2000-278109, degradation in the form of distortion characteristics caused by a saturation voltage when a large signal is input is suppressed compared with the configuration described in Japanese Unexamined Patent Application Publication No. 2000-278109. Furthermore, an increase in circuit area is suppressed compared with a configuration in which a switch circuit is provided outside the power amplification circuit and compared with the configuration described in Japanese Unexamined Patent Application Publication No. 2000-

278109. Therefore, with the power amplification circuit 100A, a power amplification circuit can be provided that includes a switch that can be used even when a large signal is input and that suppresses an increase in circuit area.

Figure 4:
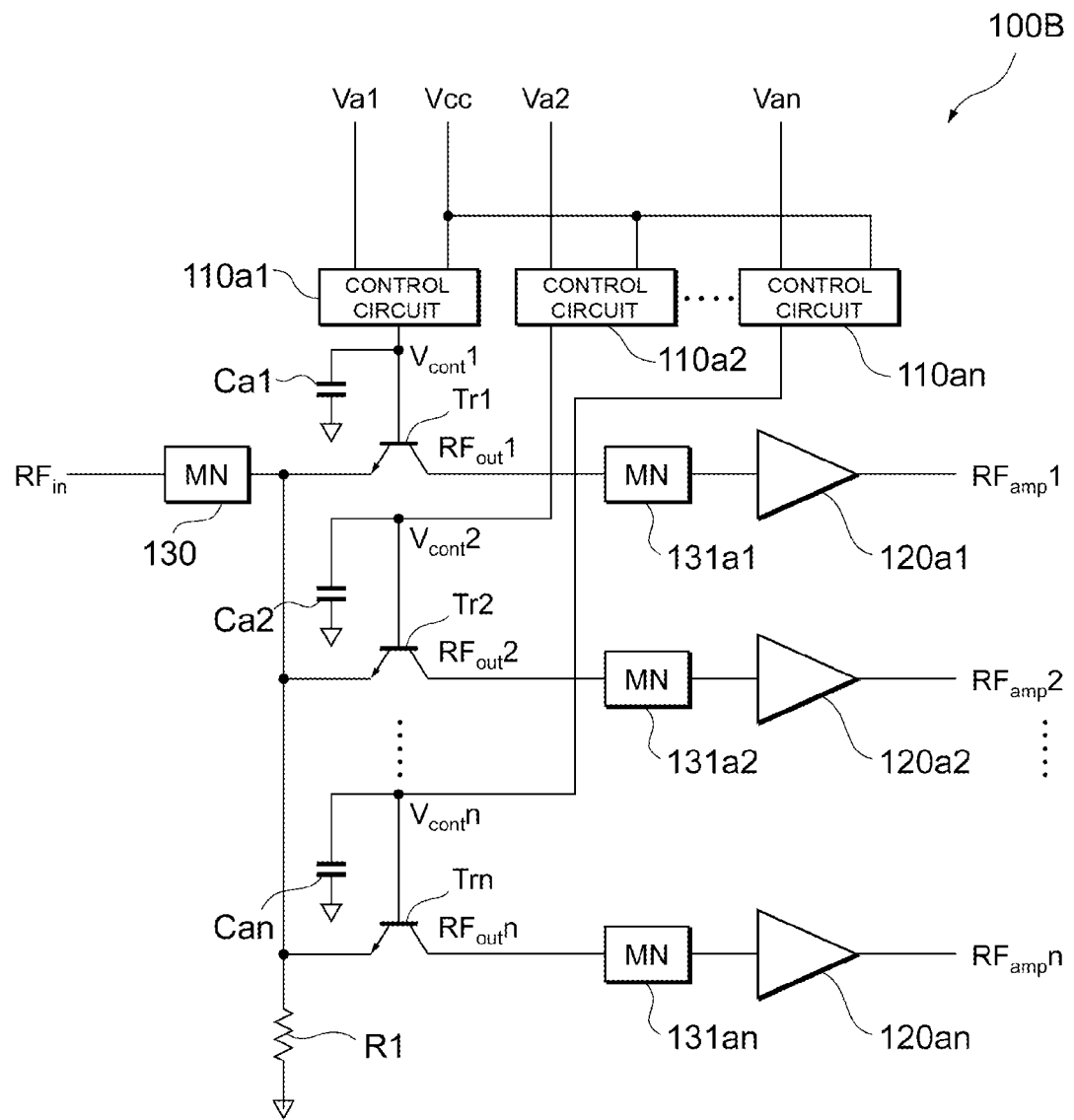
FIG. 4 illustrates another example configuration of the power amplification circuit according to an embodiment of the present disclosure.

FIG. 4 illustrates another example configuration (power amplification circuit 100B) of the power amplification circuit 100. Constituent elements that are the same as those of the power amplification circuit 100A illustrated in FIG. 1 are denoted by the same symbols and description thereof is omitted. In addition, in the embodiment described hereafter illustration of amplifiers subsequent to the amplifier of the second stage is omitted.

A power amplification circuit 100B is formed by connecting n (n is a natural number) power amplification circuits 100A in parallel with each other for a single input signal $RF_{in}$. Specifically, the power amplification circuit 100B includes n bipolar transistors Tr1, Tr2, . . . , and Trn, the resistance element R1, n capacitors Ca1, Ca2, . . . , and Can, n control circuits 110a1, 110a2, . . . , and 110an, n amplifiers 120a1, 120a2, . . . , and 120an, the matching network 130 and n matching networks 131a1, 131a2, . . . , and 131an.

The input signal $RF_{in}$ is supplied to the commonly connected emitters of the bipolar transistor Tr1 (first transistor), the bipolar transistor Tr2 (second transistor), . . . , and the bipolar transistor Trn (nth transistor) via the matching network 130. In addition, control voltages $V_{cont}1$, $V_{cont}2$, . . . , and $V_{cont}n$ generated by the control circuits 110a1, 110a2, . . . , and 110an are supplied to the bases of the bipolar transistors Tr1, Tr2, . . . , and Trn. The bipolar transistors Tr1, Tr2, . . . , and Trn respectively output output signals $RF_{out}1$ (first output signal), $RF_{out}2$ (second output signal), . . . , and $RF_{out}n$ (nth output signal) that correspond to the input signal $RF_{in}$ from the collectors thereof.

The configurations of the resistance element R1, the capacitors Ca1, Ca2, . . . , to Can and the matching networks 130, 131a, 131a2, . . . , to 131an are the same as those in the power amplification circuit 100A and therefore detailed description thereof is omitted. In this embodiment, a plurality of bipolar transistors share a single resistance element R1, but a resistance element may instead be provided for each bipolar transistor.

The control circuit 110a1 (first control circuit), the control circuit 110a2 (second control circuit), . . . , and the control circuit 110an (nth control circuit) respectively generate voltages that correspond to voltages Va1, Va2, . . . , and Van supplied from outside the power amplification circuit 100B and supply control voltages $V_{cont}1$ (first DC control voltage), $V_{cont}2$ (second DC control voltage), . . . , and $V_{cont}n$ (nth DC control voltage) to the bases of the bipolar transistors Tr1, Tr2, . . . , and Trn. For example, the bipolar transistor Tr1 is turned on by the supply of a comparatively high control voltage $V_{cont}1$ and the bipolar transistors Tr2, . . . , and Trn are switched off by the supply of comparatively low control voltages $V_{cont}2$, . . . , and $V_{cont}n$. Thus, the input signal $RF_{in}$ only passes through the bipolar transistor Tr1 and the output signal $RF_{out}1$ output by the bipolar transistor Tr1 can be selectively supplied to the amplifier 120a1. The configurations of the control circuits 110a1, 110a2, . . . , and 110an are the same as that of the control circuit 110 and therefore detailed description thereof is omitted.

The amplifiers 120a1 (first amplifier), 120a2 (second amplifier), . . . , and 120an (nth amplifier) respectively amplify the output signals $RF_{out}1$, $RF_{out}2$, . . . , and $RF_{out}n$ input via the matching networks 131a1, 131a2, . . . , and 131an and output amplified signals $RF_{amp}1$ (first amplified signal), $RF_{amp}2$ (second amplified signal), . . . , and $RF_{amp}n$ (nth amplified signal). The configurations of the amplifiers 120a1, 120a2, . . . , and 120an are the same as that of the amplifier 120 and therefore detailed description thereof is omitted.

In this configuration as well, each of the bipolar transistors Tr1, Tr2, . . . , and Trn controls switching on and off of passage of the input signal $RF_{in}$, similarly to as in the power amplification circuit 100A. Therefore, with the power amplification circuit 100B, a power amplification circuit can be provided that includes a switch that can be used even when a large signal is input and that suppresses an increase in circuit area. Thus, when an amplification mode (low power mode or high power mode, etc.) is to be switched in accordance with the signal level of the input signal $RF_{in}$, for example, the input signal $RF_{in}$ can be selectively supplied to any of the amplifiers among the amplifiers 120a1, 120a2, . . . , and 120an by using the bipolar transistors Tr1, Tr2, . . . , Trn as switches.

Figure 5:
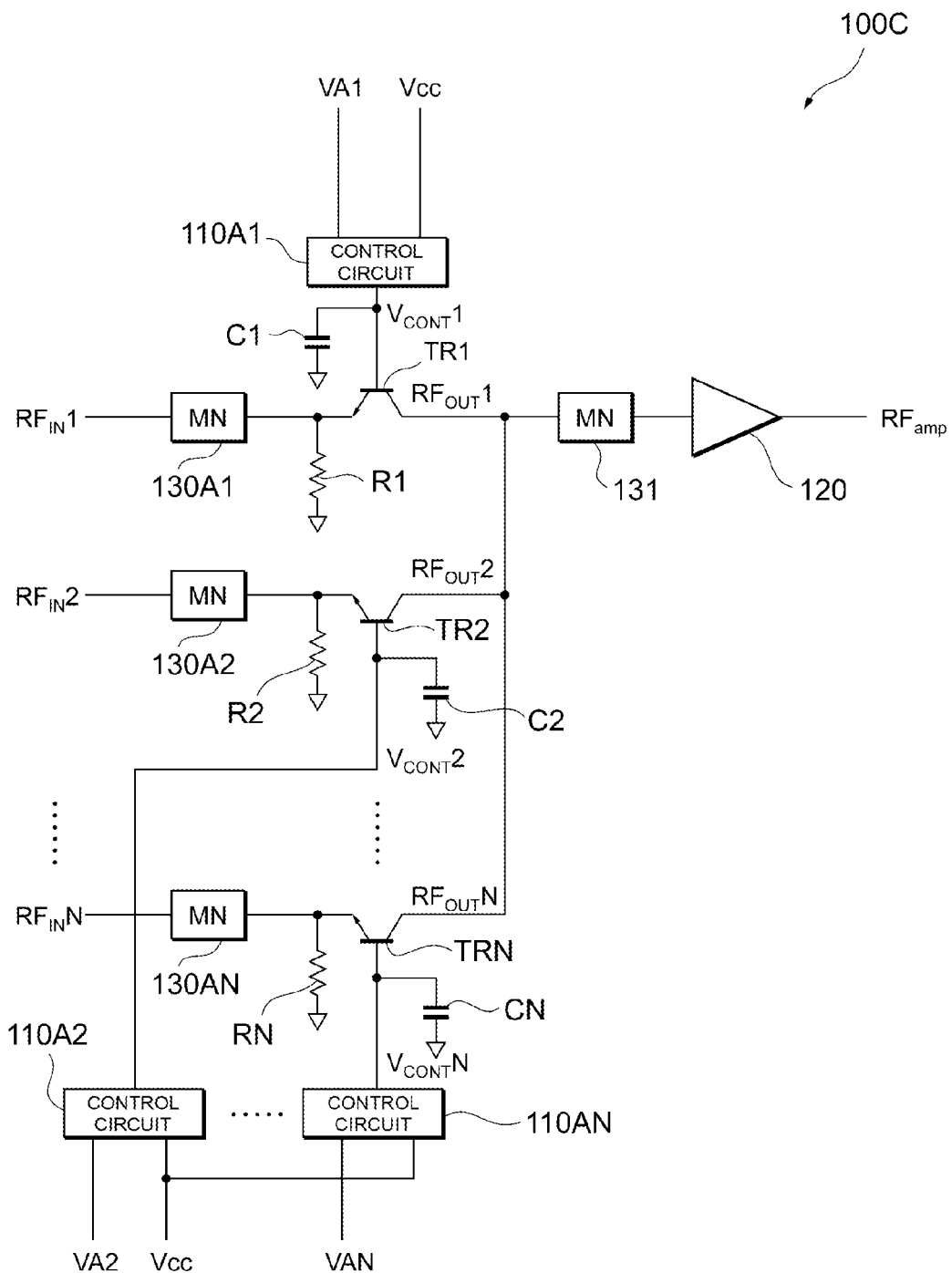
FIG. 5 illustrates another example configuration of the power amplification circuit according to an embodiment of the present disclosure.

FIG. 5 illustrates another example configuration (power amplification circuit 100C) of the power amplification circuit 100. Constituent elements that are the same as those of the power amplification circuit 100A illustrated in FIG. 1 are denoted by the same symbols and description thereof is omitted.

A power amplification circuit 100C is provided with N (N is a natural number) parallel-connected paths (signal input paths) that each contain the components of the power amplification circuit 100A illustrated in FIG. 1 up to the matching network 131 and has a common path after the matching network 131. Specifically, the power amplification circuit 100C includes N bipolar transistors TR1, TR2, . . . , and TRN, N resistance elements R1, R2, . . . , and RN, N capacitors C1, C2, . . . , and CN, N control circuits 110A1, 110A2, . . . , and 110AN, the amplifier 120, N matching networks 130A1, 130A2, . . . , and 130AN and the matching network 131.

Input signals $RF_{IN}1$ (first radio frequency signal), $RF_{IN}2$ (second radio frequency signal), . . . , and $RF_{IN}N$ (Nth radio frequency signal) are respectively supplied to the emitters of the bipolar transistors TR1 (first transistor), TR2 (third transistor), . . . , and TRN (Nth transistor) via the matching networks 130A1, 130A2, . . . , and 130AN. In addition, control voltages $V_{CONT}1$, $V_{CONT}2$, . . . , and $V_{CONT}N$ generated by the control circuits 110A1, 110A2, . . . , and 110AN are respectively supplied to the bases of the bipolar transistors TR1, TR2, . . . , and TRN. The bipolar transistors TR1, TR2, . . . , and TRN respectively output output signals $RF_{OUT}1$ (first output signal), $RF_{OUT}2$ (third output signal), . . . , and $RF_{OUT}N$ (Nth output signal) that correspond to the input signals $RF_{IN}1$, $RF_{IN}2$, . . . , and $RF_{IN}N$ from the collectors thereof.

The configurations of the resistance elements R1, R2, . . . , and RN, the capacitors C1, C2, . . . , and CN, and the matching networks 130A1, 130A2, . . . , 130AN, and 131 are the same as those in the power amplification circuit 100A and therefore detailed description thereof is omitted.

The control circuits 110A1 (first control circuit), 110A2 (third control circuit), . . . , and 110AN (Nth control circuit) respectively generate voltages that correspond to voltages VA1, VA2, . . . , and VAN supplied from outside the power amplification circuit 100C and supply control voltages $V_{CONT}1$ (first DC control voltage), $V_{CONT}2$ (third DC control voltage), . . . , and $V_{CONT}N$ (Nth DC control voltage) to the bases of the bipolar transistors TR1, TR2, . . . , and TRN. The configurations of the control circuits 110A1, 110A2, . . . , and 110AN are the same as that of the control circuit 110 and therefore detailed description thereof is omitted.

The output signals $RF_{OUT}1$, $RF_{OUT}2$, . . . , and $RF_{OUT}N$ are input to the amplifier 120 via the matching network 131. The amplifier 120 amplifies the output signals and outputs the resulting amplified signal $RF_{amp}$.

In this configuration as well, the bipolar transistors TR1, TR2, . . . , and TRN control switching on and off of passage of the input signals $RF_{IN}1$, $RF_{IN}2$, . . . , and $RF_{IN}N$, similarly to as in the power amplification circuit 100A. Therefore, with the power amplification circuit 100C, a power amplification circuit can be provided that includes a switch that can be used even when a large signal is input and that suppresses an increase in circuit area. For example, the power amplification circuit 100C can be applied to a multiband power amplification circuit in which input signals $RF_{IN}1$, $RF_{IN}2$, . . . , and $RF_{IN}N$ of different frequencies share a single amplifier 120.

Figure 6:
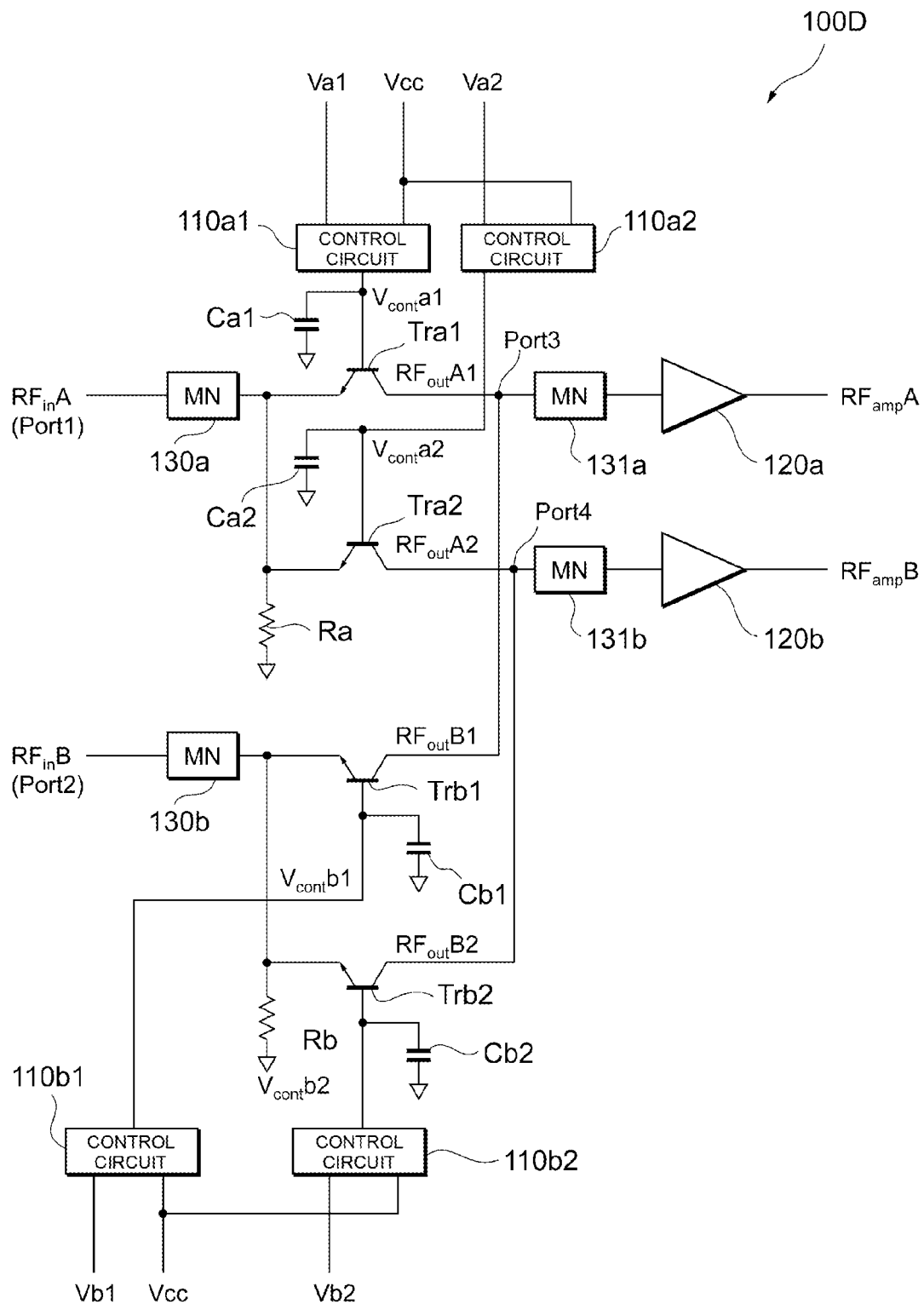
FIG. 6 illustrates another example configuration of the power amplification circuit according to an embodiment of the present disclosure.

FIG. 6 illustrates another example configuration (power amplification circuit 100D) of the power amplification circuit 100. Constituent elements that are the same as those of the power amplification circuit 100A illustrated in FIG. 1 are denoted by the same symbols and description thereof is omitted.

A power amplification circuit 100D has a configuration obtained by combining the power amplification circuit 100B illustrated in FIG. 4 and the power amplification circuit 100C illustrated in FIG. 5. Specifically, the power amplification circuit 100D includes bipolar transistors Tra1, Tra2, Trb1 and Trb2, resistance elements Ra and Rb, capacitors Ca1, Ca2, Cb1 and Cb2, control circuits 110a1, 110a2, 110b1 and 110b2, amplifiers 120a and 120b and matching networks 130a, 130b, 131a and 131b.

An input signal $RF_{in}A$ (first radio frequency signal) is supplied to the commonly connected emitters of the bipolar transistors Tra1 (first transistor) and Tra2 (second transistor) via the matching network 130a. In addition, control voltages $V_{cont}a1$ and $V_{cont}a2$ generated by the control circuits 110a1 and 110a2 are respectively supplied to the bases of the bipolar transistors Tra1 and Tra2. The bipolar transistors Tra1 and Tra2 respectively output output signals $RF_{OUT}A1$ (first output signal) and $RF_{OUT}A2$ (second output signal) corresponding to the input signal $RF_{in}A$ from the collectors thereof.

Similarly, an input signal $RF_{in}B$ (third radio frequency signal) is supplied to the commonly connected emitters of the bipolar transistors Trb1 (fourth transistor) and Trb2 (fifth transistor) via the matching network 130b. In addition, control voltages $V_{cont}b1$ and $V_{cont}b2$ generated by the control circuits 110b1 and 110b2 are respectively supplied to the bases of the bipolar transistors Trb and Trb2. The bipolar transistors Trb and Trb2 respectively output output signals $RF_{OUT}B1$ (fourth output signal) and $RF_{OUT}B2$ (fifth output signal) corresponding to the input signal $RF_{in}B$ from the collectors thereof.

The configurations of the resistance elements Ra and Rb, the capacitors Ca1, Ca2, Cb1 and Cb2 and matching network 130a, 130b, 131a and 131b are the same as those in the power amplification circuit 100A and therefore detailed description thereof is omitted.

The control circuits 110a1 (first control circuit), 110a2 (second control circuit), 110b1 (fourth control circuit) and 110b2 (fifth control circuit) respectively supply the control voltages $V_{cont}a1$ (first DC control voltage), $V_{cont}a2$ (second DC control voltage), $V_{cont}b1$ (fourth DC control voltage) and $V_{cont}b2$ (fifth DC control voltage) corresponding to the voltages Va1, Va2, Vb1 and Vb2 supplied from outside the power amplification circuit 100D to the bases of the bipolar transistors Tra1, Tra2, Trb1 and Trb2. The configurations of the control circuits 110a1, 110a2, 110b1 and 110b2 are the same as that of the control circuit 110 and therefore detailed description thereof is omitted.

The output signal $RF_{out}A1$ or the output signal $RF_{out}B1$ is input to the amplifier 120a (first amplifier) via the matching network 131a. Then, the amplifier 120a amplifies the output signal and outputs a resulting amplified signal $RF_{amp}A$ (first amplified signal).

Similarly, the output signal $RF_{out}A2$ or the output signal $RF_{out}B2$ is input to the amplifier 120b (second amplifier) via the matching network 131b. Then, the amplifier 120b amplifies the output signal and outputs a resulting amplified signal $RF_{amp}B$ (second amplified signal).

In this configuration as well, switching on and off of passage of the input signals $RF_{in}A$ and $RF_{in}B$ is controlled by switching on one of the bipolar transistors Tra1, Tra2, Trb1 and Trb2, similarly to as in the power amplification circuit 100A. Therefore, with the power amplification circuit 100D, a power amplification circuit can be provided that includes a switch that can be used even when a large signal is input and that suppresses an increase in circuit area. In addition, the input signals $RF_{in}A$ and $RF_{in}B$ can be supplied to the amplifier 120a or the amplifier 120b. For example, the power amplification circuit 100D can be applied to a multimode multiband power amplification circuit that includes amplifiers 120a and 120b for input signals $RF_{in}A$ and $RF_{in}B$ of different frequencies, the amplifiers 120a and 120b operating in different modes, and in which the input signals $RF_{in}A$ and $RF_{in}B$ of different frequencies share the amplifiers 120a and 120b.

In this embodiment, a configuration in which there are two input paths and two bipolar transistors are provided for each of the input paths is described as an example, but the number of input paths and the number of bipolar transistors provided for each input path are not limited to two and may be one or three or more.

Next, simulation results for the frequency dependency of insertion loss in the power amplification circuit 100D will be described while referring to FIGS. 7A to 10B.

FIGS. 7A to 10B are graphs illustrating simulation results of the frequency dependencies of the insertion losses of the bipolar transistors Tra1, Tra2, Trb1 and Trb2 in the power amplification circuit 100D illustrated in FIG. 6. In the graphs illustrated in FIGS. 7A to 10B, the vertical axis represents insertion loss (scattering (S) parameter=20 log|$S_{21}$|) (dB) and the horizontal axis represents the frequency (GHz) of an input signal. In addition, P1 represents an input terminal Port 1 of the input signal $RF_{in}A$, P2 represents an input terminal Port2 of the input signal $RF_{in}B$, P3 represents an output terminal Port 3 of the bipolar transistors Tra1 and Trb1 (amplifier 120a side) and P4 represents an output terminal Port4 of the bipolar transistors Tra2 and Trb2 (amplifier 120b side) (refer to FIG. 6). The S parameter of an output terminal with respect to an input terminal is expressed as dB (S(output terminal, input terminal)).

Figure 7A:
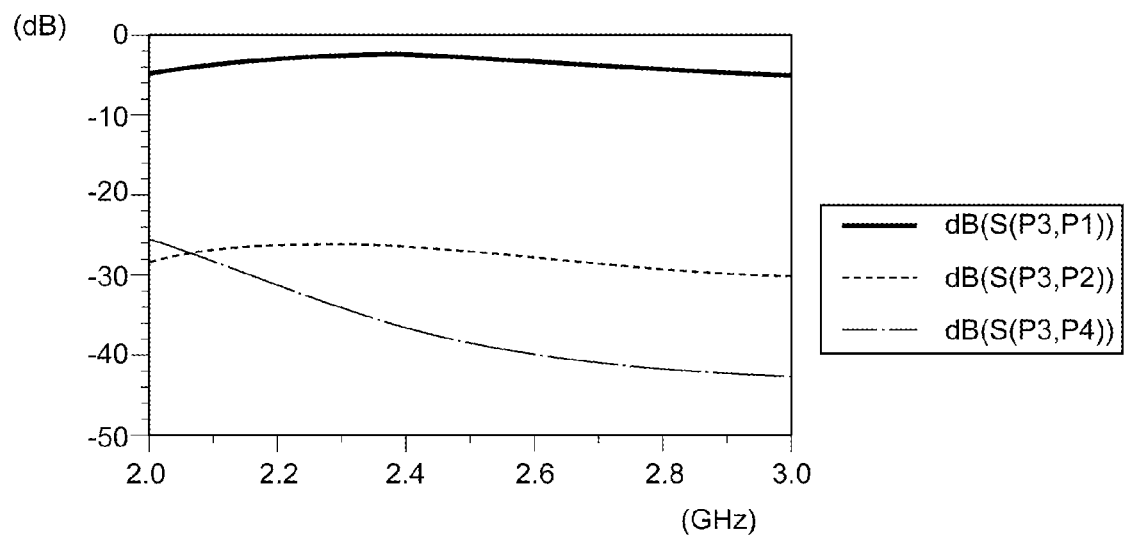
FIG. 7A is a graph illustrating simulation results of the frequency dependency of insertion loss in a power amplification circuit.
Figure 7B:
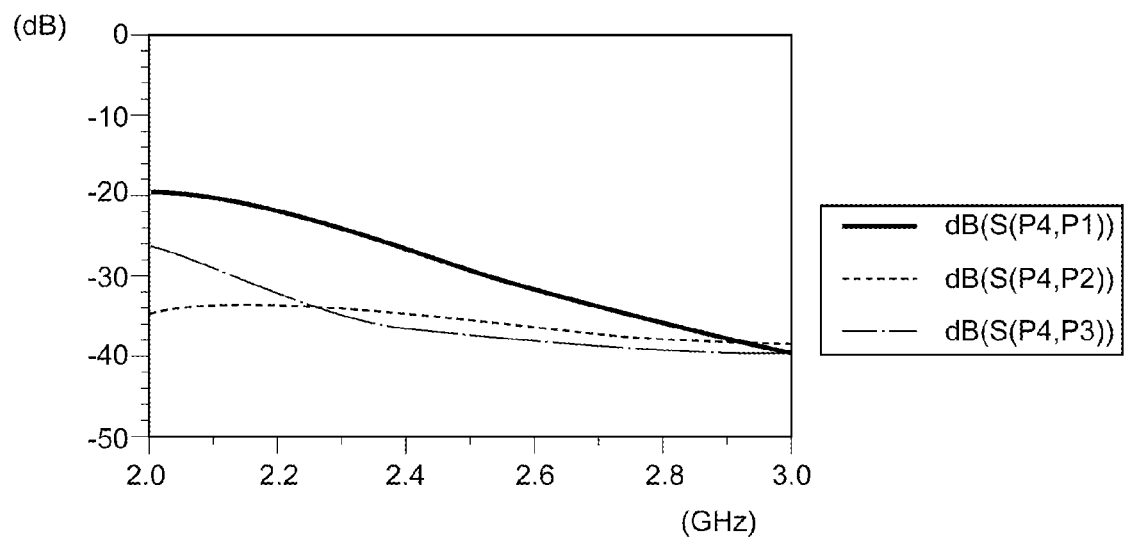
FIG. 7B is a graph illustrating simulation results of the frequency dependency of insertion loss in the power amplification circuit.

FIG. 7A illustrates simulation results for dB(S(P3, P1)), dB(S(P3, P2)) and dB(S(P3, P4)) for a case where the power amplification circuit 100D is made to operate such that only the bipolar transistor Tra1 is switched on and the bipolar transistors Tra2, Trb1 and Trb2 are switched off and consequently the input signal $RF_{in}A$ is supplied to the amplifier 120a. Similarly, FIG. 7B illustrates simulation results for dB(S(P4,P1)), dB(S(P4,P2)) and dB(S(P4,P3)) for the same case. As illustrated in FIG. 7A, the S parameter dB(S(P3, P1)) of the output of P3 with respect to the input of P1 is around −2 dB to −5 dB in all the frequency bands (2.0 to 3.0 GHz). In contrast, the S parameters for P3 from P2, P3 from P4, P4 from P1, P4 from P2 and P4 from P3 are smaller than around −20 dB. Therefore, it is clear that it is possible to selectively supply just the input signal $RF_{in}A$ to the amplifier 120a.

Figure 8A:
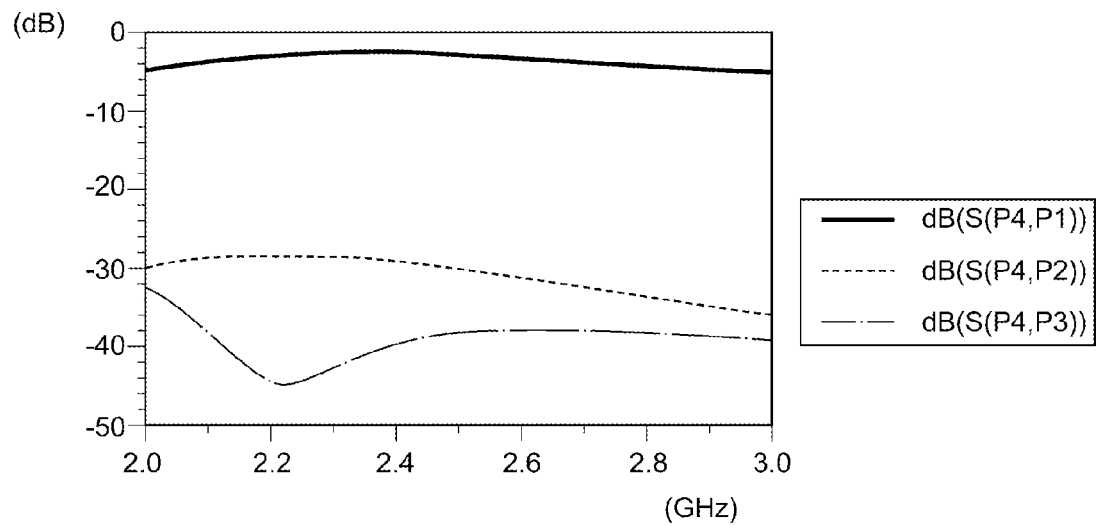
FIG. 8A is a graph illustrating simulation results of the frequency dependency of insertion loss in the power amplification circuit.
Figure 8B:
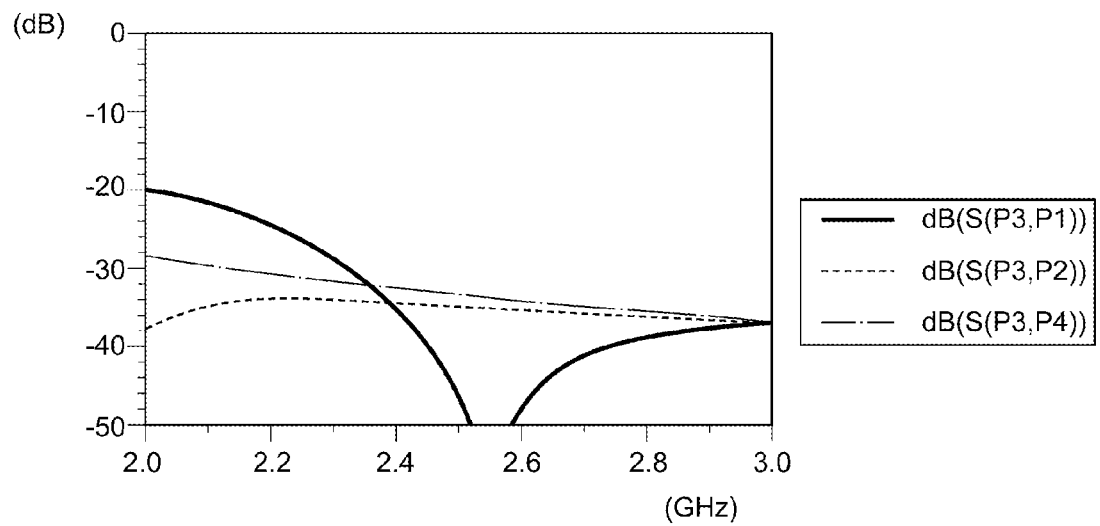
FIG. 8B is a graph illustrating simulation results of the frequency dependency of insertion loss in the power amplification circuit.

FIG. 8A illustrates simulation results for dB(S(P4, P1)), dB(S(P4, P2)) and dB(S(P4, P3)) for a case where the power amplification circuit 100D is made to operate such that only the bipolar transistor Tra2 is switched on and the bipolar transistors Tra1, Trb1 and Trb2 are switched off and consequently the input signal $RF_{in}A$ is supplied to the amplifier 120b. Similarly, FIG. 8B illustrates simulation results for dB(S(P3,P1)), dB(S(P3,P2)) and dB(S(P3,P4)) for the same case. As illustrated in FIG. 8A, the S parameter dB(S(P4, P1)) of the output of P4 with respect to the input of P1 is around −2 dB to −6 dB in all the frequency bands. In contrast, the S parameters for P4 from P2, P4 from P3, P3 from P1, P3 from P2 and P3 from P4 are smaller than around −20 dB. Therefore, it is clear that it is possible to selectively supply just the input signal $RF_{in}A$ to the amplifier 120b.

Figure 9A:
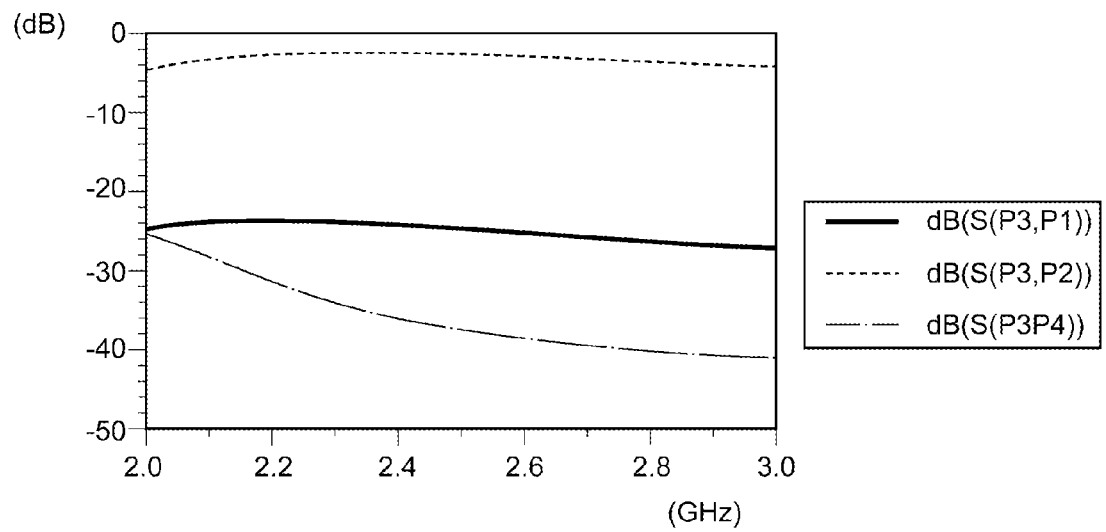
FIG. 9A is a graph illustrating simulation results of the frequency dependency of insertion loss in the power amplification circuit.
Figure 9B:
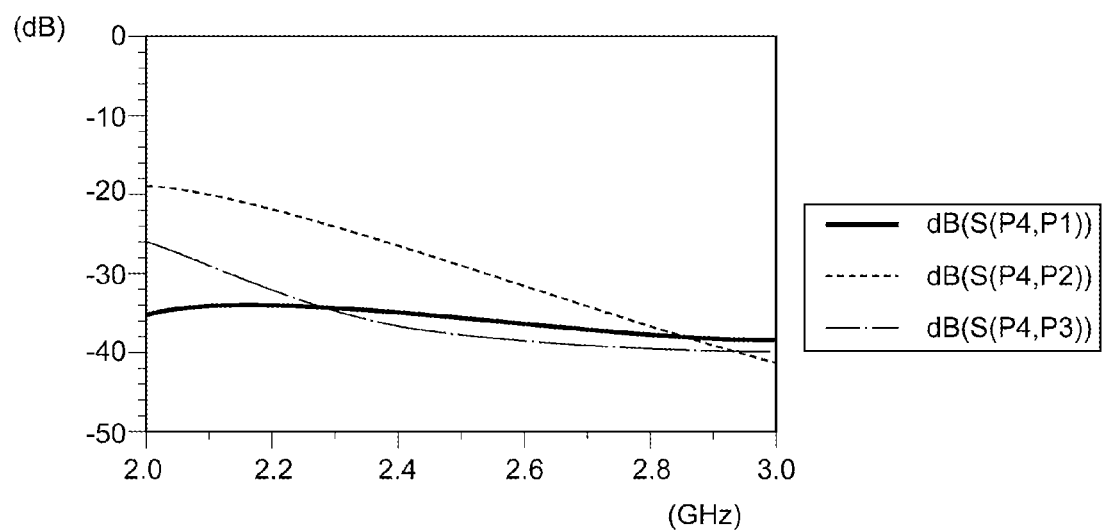
FIG. 9B is a graph illustrating simulation results of the frequency dependency of insertion loss in the power amplification circuit.

FIG. 9A illustrates simulation results for dB(S(P3, P1)), dB(S(P3, P2)) and dB(S(P3, P4)) for a case where the power amplification circuit 100D is made to operate such that only the bipolar transistor Trb1 is switched on and the bipolar transistors Tra1, Tra2, and Trb2 are switched off and consequently the input signal $RF_{in}B$ is supplied to the amplifier 120a. Similarly, FIG. 9B illustrates simulation results for dB(S(P4,P1)), dB(S(P4,P2)) and dB(S(P4,P3)) for the same case. As illustrated in FIG. 9A, the S parameter dB(S(P3, P2)) of the output of P3 with respect to the input of P2 is around −2 dB to −5 dB in all the frequency bands. In contrast, the S parameters for P3 from P1, P3 from P4, P4 from P1, P4 from P2 and P4 from P3 are smaller than around −20 dB. Therefore, it is clear that it is possible to selectively supply just the input signal $RF_{in}B$ to the amplifier 120a.

Figure 10A:
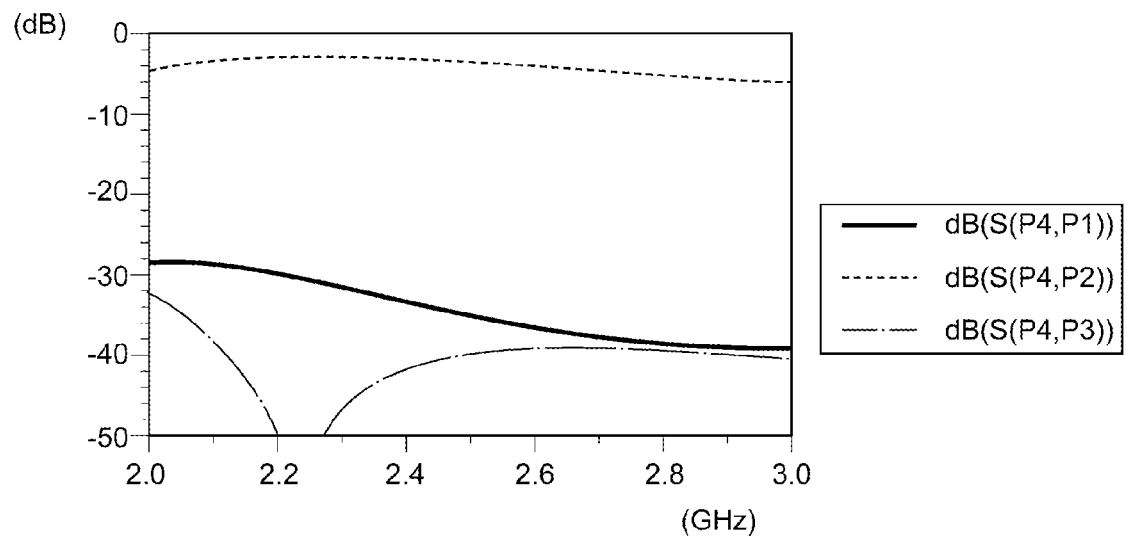
FIG. 10A is a graph illustrating simulation results of the frequency dependency of insertion loss in the power amplification circuit.
Figure 10B:
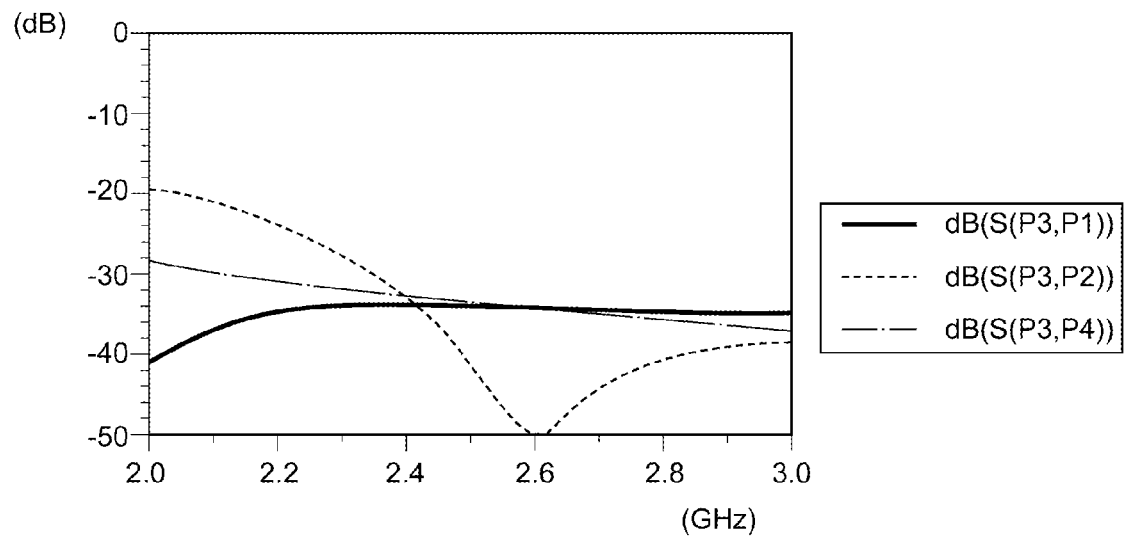
FIG. 10B is a graph illustrating simulation results of the frequency dependency of insertion loss in the power amplification circuit.

FIG. 10A illustrates simulation results for dB(S(P4, P1)), dB(S(P4, P2)) and dB(S(P4, P3)) for a case where the power amplification circuit 100D is made to operate such that only the bipolar transistor Trb2 is switched on and the bipolar transistors Tra1, Tra2, and Trb1 are switched off and consequently the input signal $RF_{in}B$ is supplied to the amplifier 120b. Similarly, FIG. 10B illustrates simulation results for dB(S(P3,P1)), dB(S(P3,P2)) and dB(S(P3,P4)) for the same case. As illustrated in FIG. 10A, the S parameter dB(S(P4, P2)) of the output of P4 with respect to the input of P2 is around −3 dB to −6 dB in all the frequency bands. In contrast, the S parameters for P4 from P1, P4 from P3, P3 from P1, P3 from P2 and P3 from P4 are smaller than around −20 dB. Therefore, it is clear that it is possible to selectively supply just the input signal $RF_{in}B$ to the amplifier 120b.

It is clear from the above-described simulation results that it is possible to selectively supply either of the input signals $RF_{in}A$ and $RF_{in}B$ to either of the amplifiers 120a and 120b by turning on one of the bipolar transistors Tra1, Tra2, Trb1 and Trb2 and turning off the rest of the bipolar transistors.

Exemplary embodiments of the present disclosure have been described above. The power amplification circuits 100A, 100B, 100C and 100D each include: a bipolar transistor that has an emitter to which a radio frequency signal is supplied, a base to which a DC control voltage is supplied and a collector from which an output signal corresponding to the radio frequency signal is output; and a control circuit that generates the DC control voltage. Thus, a single bipolar transistor controls switching on and off of passage of an input signal. Therefore, a power amplification circuit can be provided that includes a switch that can be used even when a large signal is input and that suppresses an increase in circuit area.

Furthermore, in the power amplification circuits 100A, 100B, 100C and 100D, the emitter of the bipolar transistor, which functions as a switch, can be DC grounded via a resistance element and the base of the bipolar transistor can be AC grounded using a capacitor.

The power amplification circuit 100B includes n of each of a bipolar transistor, a control circuit and an amplifier, which are the same as those of the power amplification circuit 100A, connected in parallel with each other for a single input signal $RF_{in}$. The emitters of the bipolar transistors are connected to each other and the input signal $RF_{in}$ is supplied to the emitters. Therefore, switching on and off of the n bipolar transistors is controlled by the control circuits and the input signal $RF_{in}$ can be selectively supplied to a prescribed amplifier.

In addition, the power amplification circuit 100C includes a bipolar transistor and a control circuit for each of a plurality of input signals $RF_{IN}1, RF_{IN}2, \ldots,$ and $RF_{IN}N$. The collectors of the bipolar transistors are connected to each other and the bipolar transistors respectively supply the output signals $RF_{OUT}1, RF_{OUT}2, \ldots, RF_{OUT}N$. Therefore, switching on and off of N bipolar transistors is controlled by the control circuits and it is possible to supply only a specific input signal to the amplifier 120.

Furthermore, the power amplification circuit 100D includes bipolar transistors Tra1 and Tra2, bipolar transistors Trb1 and Trb2 and control circuits 110a1, 110a2, 110b1 and 110b2 that control switching on and off of the bipolar transistors for two input signals $RF_{in}A$ and $RF_{in}B$, the components being similar to those of the power amplification circuit 100A. Thus, the input signal $RF_{in}A$ or the input signal $RF_{in}3$ can be supplied to the amplifier 120a or the amplifier 120b by switching on the appropriate one of the bipolar transistors Tra1, Tra2, Trb1 and Trb2.

Although npn-type bipolar transistors are used in this embodiment, pnp-type bipolar transistors may be used instead of the npn-type bipolar transistors.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are also included in the present disclosure. In other words, appropriate design changes made to the embodiments by one skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification circuit comprising:
a first transistor having an emitter to which a first radio frequency signal is supplied, a base to which a first DC control current or DC control voltage is supplied, and a collector from which a first output signal is output, the first output signal corresponding to the first radio frequency signal;
a first amplifier that amplifies the first output signal and outputs a first amplified signal;
a first control circuit that supplies the first DC control current or DC control voltage to the base of the first transistor thereby controlling supply of the first output signal to the first amplifier;
a resistance element; and
a capacitor,
wherein one end of the resistance element is connected to the emitter of the first transistor and another end of the resistance element is grounded, thereby DC grounding the emitter of the first transistor, and
one end of the capacitor is connected to the base of the first transistor and another end of the capacitor is grounded, and as a result, thereby AC grounding the base of the first transistor.

2. The power amplification circuit according to claim 1, further comprising:
a second transistor having an emitter to which the first radio frequency signal is supplied and that is DC grounded, a base to which a second DC control current or DC control voltage is supplied and that is AC grounded, and a collector from which a second output signal is output, the second output signal corresponding to the first radio frequency signal;
a second amplifier that amplifies the second output signal and outputs a second amplified signal; and
a second control circuit that supplies the second DC control current or DC control voltage to the base of the second transistor thereby controlling supply of the second output signal to the second amplifier.

3. The power amplification circuit according to claim 2, wherein supply of the first output signal to the first amplifier is controlled in accordance with the first DC control current or DC control voltage,
supply of the second output signal to the second amplifier is controlled in accordance with the second DC control current or DC control voltage, and
only one of the first output signal is supplied to the first amplifier and the second output signal is supplied to the second amplifier.

4. The power amplification circuit according to claim 1, further comprising:
a third transistor having an emitter to which a second radio frequency signal is supplied and that is DC grounded, a base to which a third DC control current or DC control voltage is supplied and that is AC grounded, and a collector from which a third output signal is output, the third output signal corresponding to the second radio frequency signal; and
a third control circuit that supplies the third DC control current or DC control voltage to the base of the third transistor, thereby controlling supply of the third output signal to the first amplifier.

5. The power amplification circuit according to claim 4, wherein supply of the first output signal to the first amplifier is controlled in accordance with the first DC control current or DC control voltage,
supply of the third output signal to the first amplifier is controlled in accordance with the third DC control current or DC control voltage, and
only one of the first output signal and the third output signal is supplied to the first amplifier, such that the first amplifier amplifies the first or third output signal and outputs the first amplified signal.

6. The power amplification circuit according to claim 2, further comprising:
a fourth transistor having an emitter to which a third radio frequency signal is supplied and that is DC grounded, a base to which a fourth DC control current or DC control voltage is supplied and that is AC grounded, and a collector from which a fourth output signal is output, the fourth output signal corresponding to the third radio frequency signal;
a fifth transistor having an emitter to which the third radio frequency signal is supplied and that is DC grounded, a base to which a fifth DC control current or DC control voltage is supplied and that is AC grounded, and a collector from which a fifth output signal is output, the fifth output signal corresponding to the third radio frequency signal;
a fourth control circuit that supplies the fourth DC control current or DC control voltage to the base of the fourth transistor, thereby controlling supply of the fourth output signal to the first amplifier; and
a fifth control circuit that supplies the fifth DC control current or DC control voltage to the base of the fifth transistor, thereby controlling supply of the fifth output signal to the second amplifier.

7. The power amplification circuit according to claim 6, wherein supply of the fourth output signal to the first amplifier is controlled in accordance with the fourth DC control current or DC control voltage,
supply of the fifth output signal to the second amplifier is controlled in accordance with the fifth DC control current or DC control voltage, and
only one of the first output signal and the fourth output signal is supplied to the first amplifier, and only one of the second output signal or the fifth output signal is supplied to the second amplifier, such that the first amplifier amplifies the first or fourth output signal and outputs the first amplified signal, and the second amplifier amplifies the second or fifth output signal and outputs the second amplified signal.

8. The power amplification circuit according to claim 1, wherein the first control circuit comprises a plurality of transistors, the plurality of transistors being the same type of bipolar transistors as the first transistor.

9. The power amplification circuit according to claim 2, wherein the second control circuit comprises a plurality of transistors, the plurality of transistors being the same type of bipolar transistors as the second transistor.

10. The power amplification circuit according to claim 4, wherein the third control circuit comprises a plurality of transistors, the plurality of transistors being the same type of bipolar transistors as the third transistor.

11. The power amplification circuit according to claim 6, wherein the fourth control circuit comprises a plurality of transistors, the plurality of transistors of the fourth control circuit being the same type of bipolar transistors as the first transistor, and
wherein the fifth control circuit comprises a plurality of transistors, the plurality of transistors of the fifth control circuit being the same type of bipolar transistors as the first transistor.

12. The power amplification circuit according to claim 6, wherein the power amplification circuit is multi-mode, multi-band power amplifier.

13. The power amplification circuit according to claim 4, wherein the power amplification circuit is multi-band power amplifier.

14. The power amplification circuit according to claim 1, further comprising:
a second transistor having an emitter to which the first radio frequency signal is supplied and that is DC grounded, a base to which a second DC control current or DC control voltage is supplied and that is AC grounded, and a collector from which a second output signal is output, the second output signal corresponding to the first radio frequency signal;
a second amplifier that amplifies the second output signal and outputs a second amplified signal; and
a second control circuit that supplies the second DC control current or DC control voltage to the base of the second transistor thereby controlling supply of the second output signal to the second amplifier;
wherein supply of the first output signal to the first amplifier is controlled in accordance with the first DC control current or DC control voltage,
supply of the second output signal to the second amplifier is controlled in accordance with the second DC control current or DC control voltage, and
only one of the first output signal is supplied to the first amplifier and the second output signal is supplied to the second amplifier.

15. The power amplification circuit according to claim 1, further comprising:
a third transistor having an emitter to which a second radio frequency signal is supplied and that is DC grounded, a base to which a third DC control current or DC control voltage is supplied and that is AC grounded, and a collector from which a third output signal is output, the third output signal corresponding to the second radio frequency signal; and
a third control circuit that supplies the third DC control current or DC control voltage to the base of the third transistor, thereby controlling supply of the third output signal to the first amplifier;
wherein supply of the first output signal to the first amplifier is controlled in accordance with the first DC control current or DC control voltage,
supply of the third output signal to the first amplifier is controlled in accordance with the third DC control current or DC control voltage, and
only one of the first output signal and the third output signal is supplied to the first amplifier, such that the first amplifier amplifies the first or third output signal and outputs the first amplified signal.

16. The power amplification circuit according to claim 14, wherein the first amplifier and the second amplifier comprise heterojunction bipolar transistors.

17. The power amplification circuit according to claim 15, wherein the first amplifier and the second amplifier comprise heterojunction bipolar transistors.

18. A power amplification circuit comprising:
a first transistor having an emitter to which a first radio frequency signal is supplied, a base to which a first DC control current or DC control voltage is supplied, and a collector from which a first output signal is output, the first output signal corresponding to the first radio frequency signal;
a first amplifier that amplifies the first output signal and outputs a first amplified signal;
a first control circuit that supplies the first DC control current or DC control voltage to the base of the first transistor thereby controlling supply of the first output signal to the first amplifier;
a second transistor having an emitter to which the first radio frequency signal is supplied and that is DC grounded, a base to which a second DC control current or DC control voltage is supplied and that is AC grounded, and a collector from which a second output signal is output, the second output signal corresponding to the first radio frequency signal;
a second amplifier that amplifies the second output signal and outputs a second amplified signal; and
a second control circuit that supplies the second DC control current or DC control voltage to the base of the second transistor thereby controlling supply of the second output signal to the second amplifier.

19. A power amplification circuit comprising:
a first transistor having an emitter to which a first radio frequency signal is supplied, a base to which a first DC control current or DC control voltage is supplied, and a collector from which a first output signal is output, the first output signal corresponding to the first radio frequency signal;
a first amplifier that amplifies the first output signal and outputs a first amplified signal;
a first control circuit that supplies the first DC control current or DC control voltage to the base of the first transistor thereby controlling supply of the first output signal to the first amplifier;
a third transistor having an emitter to which a second radio frequency signal is supplied and that is DC grounded, a base to which a third DC control current or DC control voltage is supplied and that is AC grounded, and a collector from which a third output signal is output, the third output signal corresponding to the second radio frequency signal; and
a third control circuit that supplies the third DC control current or DC control voltage to the base of the third transistor, thereby controlling supply of the third output signal to the first amplifier.

* * * * *

UNITED STATES PATENT AND TRADEMARK OFFICE
CERTIFICATE OF CORRECTION

PATENT NO. : 9,917,550 B2
APPLICATION NO. : 15/381528
DATED : March 13, 2018
INVENTOR(S) : Masatoshi Hase It is certified that error appears in the above-identified patent and that said Letters Patent is hereby corrected as shown below:

In the Specification

Column 10, Line 35, "$RF_{in}3$" should be -- $RF_{in}B$ --.

Signed and Sealed this
Nineteenth Day of June, 2018

Andrei Iancu
*Director of the United States Patent and Trademark Office*